US012770674B2

(12) United States Patent
Li et al.

(10) Patent No.: US 12,770,674 B2
(45) Date of Patent: Oct. 20, 2026

(54) APPARATUSES AND METHODS FOR CONDUCTIVE COUPLING OF BIT LINES USING BIT LINE SWITCHES

(71) Applicant: Micron Technology, Inc., Boise, ID (US)

(72) Inventors: Jiyun Li, Boise, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 18/776,897

(22) Filed: Jul. 18, 2024

(65) Prior Publication Data

US 2025/0201299 A1 Jun. 19, 2025

Related U.S. Application Data

(60) Provisional application No. 63/610,208, filed on Dec. 14, 2023.

(51) Int. Cl.

*G11C 11/4091* (2006.01)
*G11C 11/408* (2006.01)
*G11C 11/4094* (2006.01)

(52) U.S. Cl.

CPC ...... *G11C 11/4091* (2013.01); *G11C 11/4087* (2013.01); *G11C 11/4094* (2013.01)

(58) Field of Classification Search

CPC ............ G11C 11/4091; G11C 11/4087; G11C 11/4094

See application file for complete search history.

(56) References Cited

U.S. PATENT DOCUMENTS

2007/0104002 A1* 5/2007 Edahiro .................. G11C 7/18 365/185.21
2008/0037309 A1* 2/2008 Makino ............... G11C 11/4097 365/207
2009/0251948 A1* 10/2009 Kajigaya ............ G11C 11/4076 365/207

* cited by examiner

*Primary Examiner* — Han Yang
(74) *Attorney, Agent, or Firm* — Dorsey & Whitney LLP

(57) ABSTRACT

Apparatus and methods for providing a conductive path between bit lines using bit line switches are disclosed. An example apparatus includes a memory mat comprising a first plurality of bit lines and a second plurality of bit lines. A plurality of bit line switches can be activated to provide a conductive path between respective ones of the first plurality of bit lines and a second plurality of bit lines. For example, the bit line switches can be activated during a threshold voltage compensation phase or operation and deactivated during a memory cell activation phase or operation.

15 Claims, 8 Drawing Sheets

APPARATUSES AND METHODS FOR CONDUCTIVE COUPLING OF BIT LINES USING BIT LINE SWITCHES

CROSS-REFERENCE TO RELATED APPLICATION

This application claims the filing benefit of U.S. Provisional Application No. 63/610,208, filed Dec. 14, 2023. This application is incorporated by reference herein in its entirety and for all purposes.

BACKGROUND

Information may be stored on individual memory cells of a memory as a physical signal (e.g., a charge on a capacitive element), for example, memory cells of a volatile memory, including dynamic random access memory (DRAM). When accessed, the memory cell may be coupled to a digit line (or bit line), which in turn may be coupled to a sense amplifier. Along with the digit line coupled to the memory cell, a second, complimentary digit line may also be coupled to the sense amplifier. The use of complimentary digit lines may be useful for providing a reference voltage level to better distinguish the value being read from/written to the memory cell. However, this may require the use of dedicated reference digit lines, for example at the edges of the memory array, which may increase the size of the memory array. There is increasingly a need for memory devices with reduced size.

DETAILED DESCRIPTION OF THE EMBODIMENTS

Figure 1:
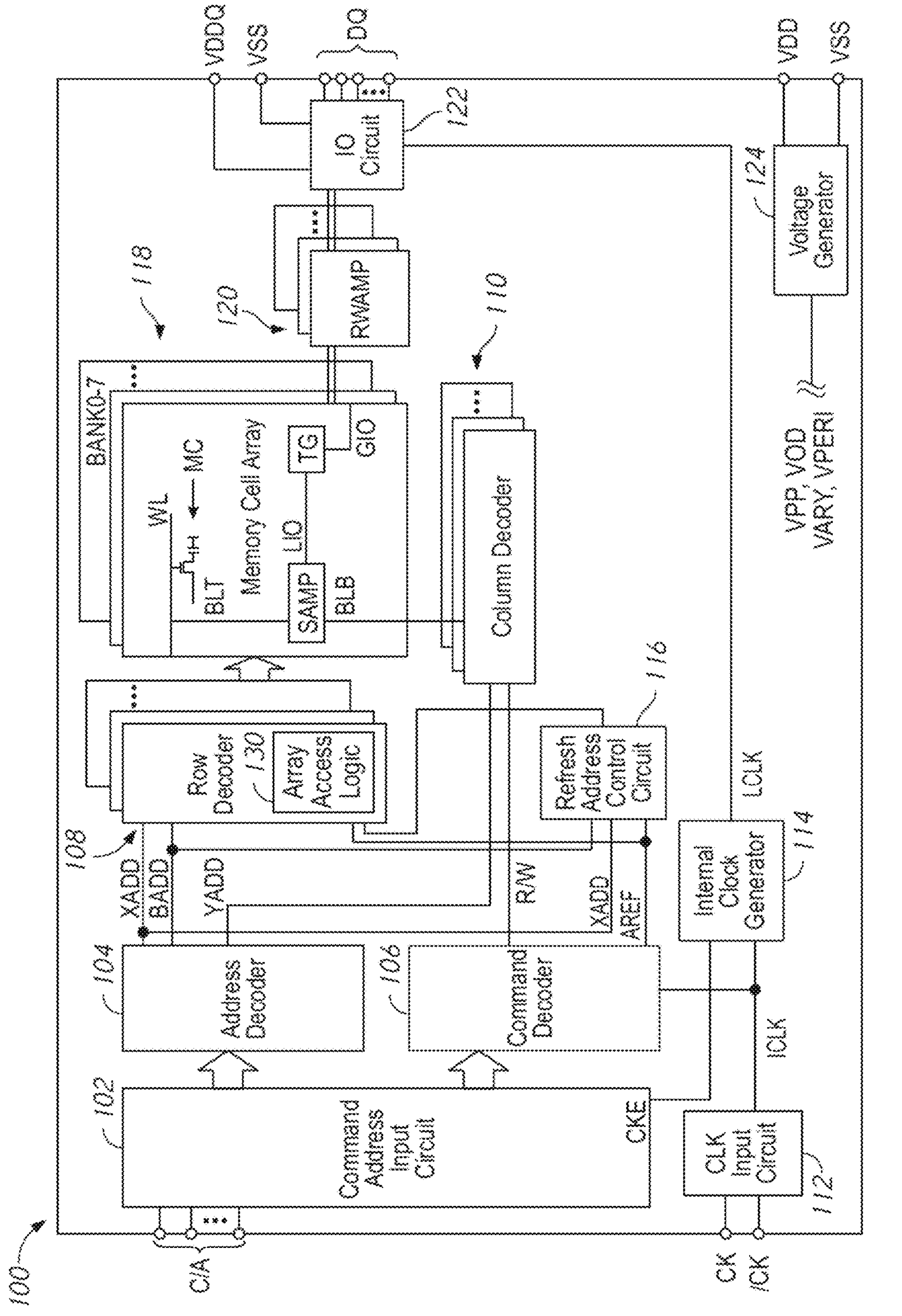
FIG. 1 is a block diagram of a semiconductor device, in accordance with an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory devices may include a memory array, which includes a number of memory cells, each of which may store information. For example, each memory cell may store a single bit of information. The memory cells may be located at the intersections of word lines (rows) and digit lines (bit lines/columns). Each word line may be associated with a row address, and each digit line may be associated with a column address. Accordingly, memory cells may be specified by their row and column addresses. When a memory cell is accessed (e.g., a read or write operation), the memory cell may be coupled via the bit line to a sense amplifier. For example in a read operation, the value stored in the memory cell (e.g., as a capacitive charge) may change a voltage of the bit line. The sense amplifier may detect this change, amplify the voltage to a system level (e.g., a voltage which represents logical high or a voltage which represents logical low) and then provide those voltages along a local input/output line (LIO) and global input/output line (GIO) to read/write amplifiers, which in turn may send the voltage to data terminals of the memory. During an example write operation, the process may generally be reversed (e.g., from GIO to LIO, to sense amplifier to bit line to memory cell).

In a conventional memory device, the sense amplifier may use a complimentary, double-ended architecture. In a double-ended architecture, the sense amplifier may be coupled to a first digit line extending through a first memory mat and also coupled to a second digit line that extends through a second memory mat. The first digit line is coupled to an accessed memory cell and the second digit line may be used as a reference. The use of complementary digit lines may be useful for differentiating between different voltages (e.g., by comparing the complementary values). A word line is used to activate one or more memory cells to provide a respective stored charge state to a respective digit line. During operation, one word line may be activated to read out data from the activated memory cell along the first digit line, while the second digit line may act as a reference. However, having sense amplifiers coupled to digit lines of different memory mats may present problems at memory mats along edges of the memory array. For example, some of the digit lines in the edge memory mat may not be useable because they are not coupled to a corresponding sense amplifier, which results in wasted space on the semiconductor die. To address this issue, in some memory devices edge memory mats include folded bit lines that wrap back upon themselves. Although this approach reduces some of the wasted space, there is still room for improvement.

The present disclosure is drawn to apparatuses, systems, and methods for conductive coupling of bit lines using bit line switches. An edge mat may include a first plurality of bit lines coupled to a plurality of double-ended sense amplifiers and a second plurality of bit lines coupled to a plurality of single-ended sense amplifiers. Additionally, each of a plurality of bit line switches is coupled to a respective bit line of the first plurality of bit lines and coupled to a respective bit line of the second plurality of bit lines. Each bit line switch of the plurality of bit line switches, when activated, provides a conductive path between the respective bit line of the first plurality of bit lines and the respective bit line of the second plurality of bit lines. In some embodiments, the conductive path can be provided during a compensation phase or operation. Each bit line switch of the plurality of bit line switches can be deactivated during other phases or operations, such as during a sense phase or operation.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

FIG. 1 is a block diagram of a semiconductor device 100, in accordance with an embodiment of the disclosure. The semiconductor device 100 can be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks can be included in the memory array 118 of other embodiments. Each memory bank includes a plurality of word lines WL, a plurality of bit lines BLT and BLB, and a plurality of memory cells MC arranged at intersections of the plurality of word lines WL and the plurality of bit lines BLT (and BLB). The selection of the word line WL is performed by a row decoder 108 and the selection of the bit lines BLT, BLB is performed by a column decoder 110. In the embodiment of FIG. 1, the row decoder 108 includes a respective row decoder for each memory bank and the column decoder 110 includes a respective column decoder for each memory bank. The bit lines BLT, BLB are coupled to a respective sense amplifier (SAMP). Read data from the bit line BLT (or BLB) is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BLT (or BLB).

The memory device 100 may include a mixture of single-ended sense amplifiers which are coupled to a single bit line or digit line BLT or BLB, and double-ended sense amplifiers which are coupled to two digit lines BLT and BLB. Examples of the different types of sense amplifiers and their arrangement in a memory device is described in more detail herein.

The memory device 100 may include a plurality of bit line switches (not shown) that each provide a conductive path between two bit lines in response to a command or signal (not shown) provided by an array access logic 130. A first bit line of the two bit lines can be coupled to a single-ended sense amplifier and a second bit line of the two bit lines can be coupled to a double-ended sense amplifier, which is further coupled to a third bit line. In response to the command or signal provided by the array access logic 130, one or more bit line switches of the plurality of bit line switches are activated to provide a conductive path between respective ones of the first bit line of the two bit lines and the second bit line of the two bit lines. In some embodiments, the bit line switch is activated during a threshold voltage compensation operation or threshold voltage compensation phase performed for the double-ended sense amplifier. The bit line switch can be deactivated, such that the conductive path is not provided, for example, during a memory cell activation operation or memory access phase (e.g., a sense operation or sense phase). Although the array access logic 130 is depicted as being included in the row decoder 108, it may be located elsewhere in some implementations.

The semiconductor device 100 may employ a plurality of external terminals that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. For example, the internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal, which may select one or more of the sense amplifiers SAMP. The address decoder 104 may also supply a decoded bank address BADD, which may indicate the bank of the memory array 118 containing the decoded row address XADD and column address YADD. The C/A terminals may be supplied with commands. Examples of commands include activate commands for activating pages of memory, access commands for accessing the memory, such as read commands for performing read operations and write commands for performing write operations, as well as other commands and operations. The activate and access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When activate and read commands are received, and a bank address, a row address and a column address are timely supplied with the activate and read commands, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When activate and write commands are received, and a bank address, a row address and a column address are timely supplied with the activate and write commands, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The memory 100 may include single-ended sense amplifiers each of which has an input terminal coupled to a digit line BLT which carries a voltage based on a memory cell. The single-ended sense amplifier also has a number of terminals coupled to various control signals which the row decoder 108 and/or column decoder 110 may provide to operate the sense amplifier during various operations. The memory array 118 may also include double-ended sense amplifiers.

The device 100 may also receive commands causing it to carry out one or more refresh operations as part of a self-refresh mode. When an external signal indicates a self-refresh entry command, the refresh signal AREF may also be activated. The refresh signal AREF is supplied to the refresh control circuit 116. The refresh control circuit 116 supplies a refresh row address RXADD to the row decoder 108, which may refresh one or more word lines WL indicated by the refresh row address RXADD. The refresh control circuit 116 may control a timing of the refresh operation, and may generate and provide the refresh address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals.

The power supply terminals are also supplied with power supply potential VDDQ. The power supply potentials VDDQ and VSS are supplied to the input/output circuit 122. The power supply potential VDDQ supplied to the power supply terminals may be the same potentials as the power supply potential VDD supplied to the power supply terminals in an embodiment of the disclosure. The power supply potential VDDQ supplied to the power supply terminals may be a different potential from the power supply potential VDD supplied to the power supply terminals in another embodiment of the disclosure. The power supply potential VDD supplied to the power supply terminals are used for the input/output circuit 122 so that power supply noise generated by the input/output circuit 122 does not propagate to the other circuit blocks.

Figure 2:
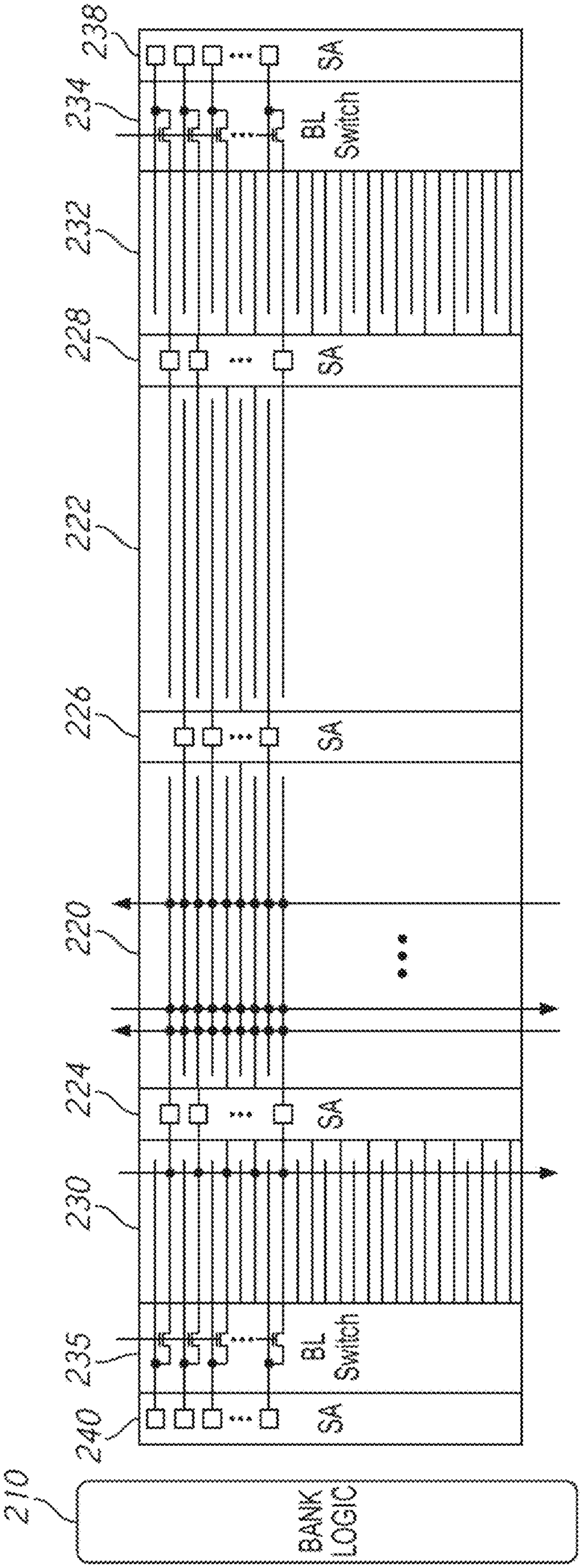
FIG. 2 is a block diagram of an architecture of a semiconductor device, in accordance with an embodiment of the present disclosure.

FIG. 2 is a block diagram of an architecture of a semiconductor device 200, in accordance with an embodiment of the present disclosure. The semiconductor device 200 can be a semiconductor memory device, such as a DRAM device integrated on a single semiconductor chip. The semiconductor device 200 can, in some embodiments, be an implementation of the array 118 and/or the semiconductor device 100 of FIG. 1. For example, the semiconductor device 200 shows a single bank of a memory array and its associated logic. For the sake of brevity, features and operations analogous to those previously discussed with respect to FIG. 1 may not be repeated again with respect to FIG. 2.

The semiconductor device 200 includes bank logic 210. The bank logic 210 includes various circuits, such as row decoders (e.g., 108 of FIG. 1) and refresh control circuits (e.g., 116 of FIG. 1) which manage operations of the bank. For example, local input/output lines (not shown) may couple data between the bank logic 210 and the various sense amplifier regions and mats. Similarly, the bank logic 210 may provide control signals (not shown) to operate the mats and sense amplifier regions. The various circuits included in the bank logic 210 can include array access logic (e.g., 130 of FIG. 1), which can be included in the row decoders (e.g., 108 of FIG. 1).

The semiconductor device 200 shows two example normal mats 220 and 222 (e.g., included in the array 118 of FIG. 1). The normal mats 220 and 222 include memory cells at intersections of word lines and bit lines. Some example memory cells, shown as dots, are depicted in FIG. 2, however not all memory cells are depicted in FIG. 2. For the sake of illustration, only two normal mats are shown, however in other embodiments there may be more or fewer memory mats. The normal mats 220 and 222 are separated from each other by a sense amplifier region 226. There are additional sense amplifier regions 224 and 228 at the edge of mats 220 and 222 respectively. Each sense amplifier region 224-228 includes a number of sense amplifiers, each of which are coupled to one or more bit lines in the adjacent normal mats 220 and 222. For example, a region which is between two normal mats, such as 226, has sense amplifiers that are coupled to a bit line in each of the adjacent normal mats 220 and 222. Each normal mat may alternate which adjacent sense amplifier region the bit lines are coupled to. For example, in mat 220, a first bit line is coupled to region 224, a second bit line is coupled to region 226, a third bit line is coupled to region 224, etc.

Since the normal mats use an open-ended architecture, and since sense amplifiers have two inputs, the sense amplifiers at an edge of the normal mats, such as those included in sense amplifier regions 224 and 228, may be coupled to an edge mat, such as 230 and 232 respectively. The sense amplifier region 224 has amplifiers coupled to a bit line in normal mat 220 and coupled to a bit line in the edge mat 230. The sense amplifier region 228 has amplifiers coupled to a bit line in a normal mat 222 and coupled to a bit line in the edge mat 232.

Bit line switch regions 234 and 235 each include a plurality of bit line switches, and single-ended sense amplifier regions 238 and 240 include a plurality of single-ended sense amplifiers. Edge mat 230 includes bit lines coupled to respective bit line switches of bit line switch region 235 and further coupled to respective single-ended sense amplifiers of single-ended sense amplifier region 240. Edge mat 232 includes bit lines coupled to respective bit line switches of bit line switch region 234 and further coupled to respective single-ended sense amplifiers of single-ended sense amplifier region 238.

When activated (e.g., in response to a command or signal from the bank logic 210), each bit line switch in the bit line switch regions 234 and 236 provides a conductive path between two bit lines in the adjacent edge mat 230 and 232. In some embodiments, each bit line in the edge mat 230 and 232 may be exactly or approximately half the length of a bit line in the adjacent normal mat 220 and 222. In some embodiments, each bit line in the edge mat 230 and 232 may be greater than or less than half the length of a bit line in the adjacent normal mat 220 and 222. A conductive path may be provided between two bit lines in the edge mat 232 using a bit line switch in the bit line switch region 234. The two bit lines having a conductive path therebetween via the activated bit line switch can provide a reference voltage to a sense amplifier in the sense amplifier region 228, which is also coupled to a bit line included in the normal mat 222 (e.g., during a threshold voltage compensation operation or phase). Similarly, a conductive path may be provided between two bit lines in the edge mat 230 using a bit line switch in the bit line switch region 236. The two bit lines having a conductive path therebetween via the activated bit line switch can provide a reference voltage to a sense amplifier in the sense amplifier region 224, which is also coupled to a bit line included in the normal mat 220 (e.g., during a threshold voltage compensation operation or phase).

The bit line switches in the bit line switch regions 234 and 236 can be deactivated during other operations or phases, such that no conductive path is provided between bit lines in the edge mats 230 and 232. For example, single-ended sense amplifiers in the single-ended amplifier regions 238 and 240 can be used to perform memory access operations using bit lines in the edge mats 230 and 232, during which the bit line switches are not activated.

Bit lines in the edge mats 230 and 232 may be alternately coupled to adjacent sense amplifier regions 224 and 228 and single-ended sense amplifier regions 238 and 240. For example, a first bit line in edge mat 232 can be coupled to a sense amplifier in sense amplifier region 228, a second bit line in edge mat 232 can be coupled to a single-ended sense amplifier in single-ended sense amplifier region 238, a third bit line in edge mat 232 can be coupled to a sense amplifier in sense amplifier region 228, and so forth. The first bit line and the second bit line are coupled to a respective bit line switch in the bit line switch region 234. When activated, the bit line switch provides a conductive path between the first and second bit lines, for example, to provide a reference voltage for a sense amplifier in the sense amplifier region 228. However, when the bit line switch is deactivated, a conductive path is not provided between the first and second bit lines, for example, during memory access operations to memory cells coupled to the first bit line and memory cells coupled to the second bit line.

Figure 3:
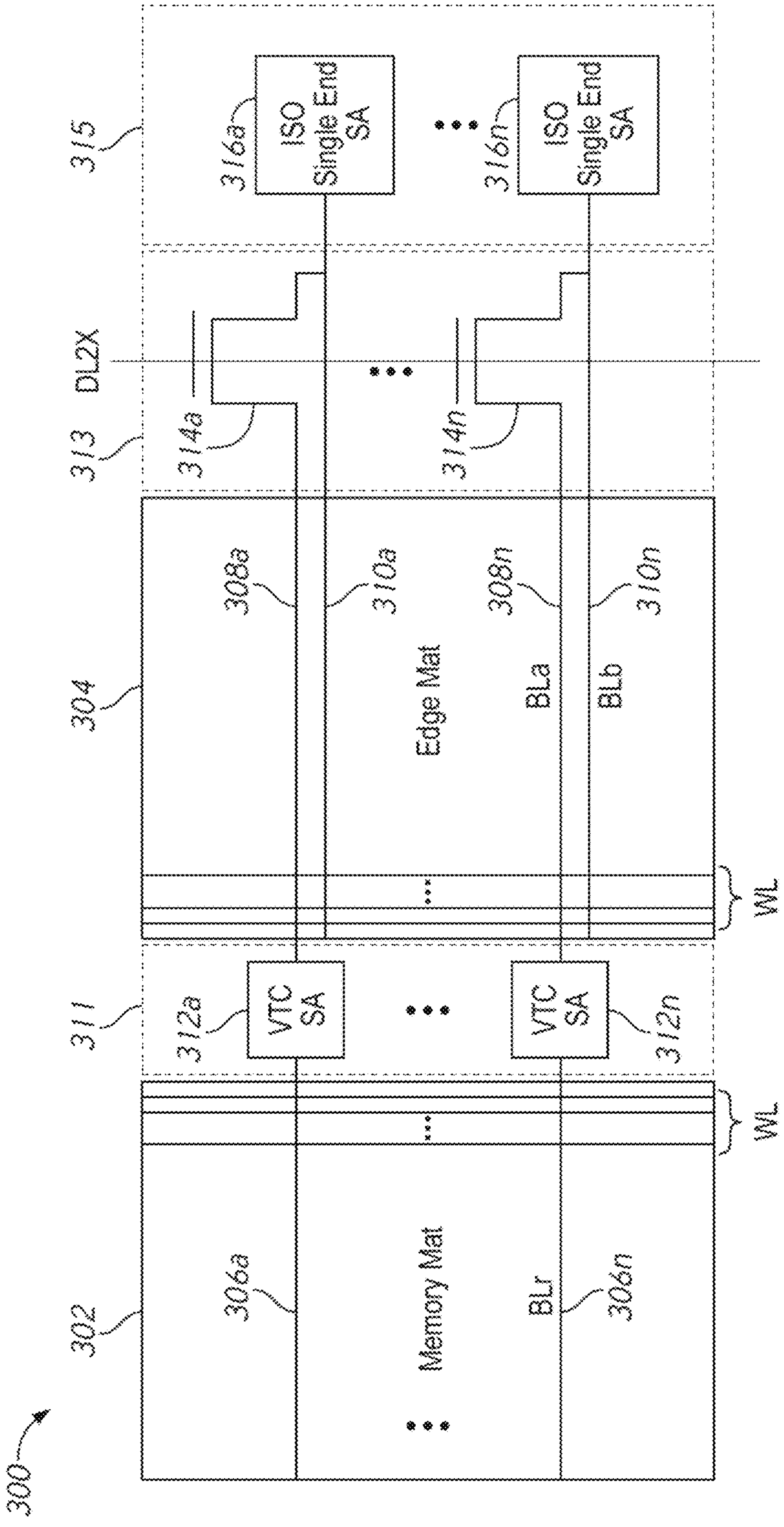
FIG. 3 is a block diagram of a semiconductor device, in accordance with an embodiment of the present disclosure.

FIG. 3 is a block diagram of a semiconductor device 300, in accordance with an embodiment of the present disclosure. In some embodiments of the disclosure, the semiconductor device 300 can be, for example, included in the semiconductor device 200 of FIG. 2 and/or the array 118 or the semiconductor device 100 of FIG. 1.

The semiconductor device 300 includes a memory mat 302 (e.g., 220 or 222 of FIG. 2) and an edge mat 304 (e.g., 230 or 232 of FIG. 2). The memory mat 302 includes a first plurality of bit lines 306*a-n* and a plurality of word lines WL. The edge mat 304 includes a second plurality of bit lines 308*a-n* and a third plurality of bit lines 310*a-n*, and further includes word lines WL. The memory mat 302 and the edge mat 304 includes memory cells, which are arranged at intersections of the respective bit lines and word lines. The semiconductor device 300 includes a sense amplifier region 311 (e.g., 224 or 228 of FIG. 2) including a plurality of sense amplifiers 312*a-n* each coupled to a bit line of the first plurality of bit lines 306*a-n* and a bit line of the second plurality of bit lines 308*a-n*. In some embodiments, the plurality of sense amplifiers 312*a-n* can be threshold voltage compensation sense amplifiers.

The semiconductor device 300 further includes a bit line switch region 313 (e.g., 234 or 236 of FIG. 2) including a plurality of bit line switches 314*a-n*. Each bit line switch 314*a-n* is coupled to a bit line of the second plurality of bit lines 308*a-n* in the edge mat 304 and to a bit line of the third plurality of bit lines 310*a-n* in the edge mat 304, such that a bit line switch 314*a-n*, when activated, provides a conductive path between the bit line of the second plurality of bit lines 308*a-n* and the bit line of the third plurality of bit lines 310*a-n*. A bit line switch control signal DL2X is provided to the bit line switches 314*a-n*, which are activated when the DL2X signal is active (e.g., active high logical level). The DL2X signal may be provided, for example, by array access logic (e.g., array access logic 130). In some embodiments, the bit line switches 314*a-n* can be configured to be activated to provide the conductive path during a threshold voltage compensation operation or phase (e.g., for a respective one of the sense amplifiers 312*a-n*).

The semiconductor device 300 further includes a single-ended sense amplifier region 315 (e.g., 238 or 240 of FIG. 2) including a plurality of single-ended sense amplifiers 316*a-n*, which are each coupled to a bit line of the third plurality of bit lines 310*a-n*. The bit line switch 314*a-n* can be deactivated, such that no conductive path is provided between a bit line of the second plurality of bit lines 308*a-n* and a bit line of the third plurality of bit lines 310*a-n*. The bit line switch 314*a-n* can be deactivated, for example, to perform a memory cell access operation or phase, such as to access a memory cell coupled to a bit line of the third plurality of bit lines 310*a-n* using a single-ended sense amplifier of the plurality of single-ended sense amplifiers 316*a-n* and/or to access a memory cell coupled to a bit line of the second plurality of bit lines 308*a-n* using a sense amplifier of the plurality of sense amplifiers 312*a-n*.

Figure 4:
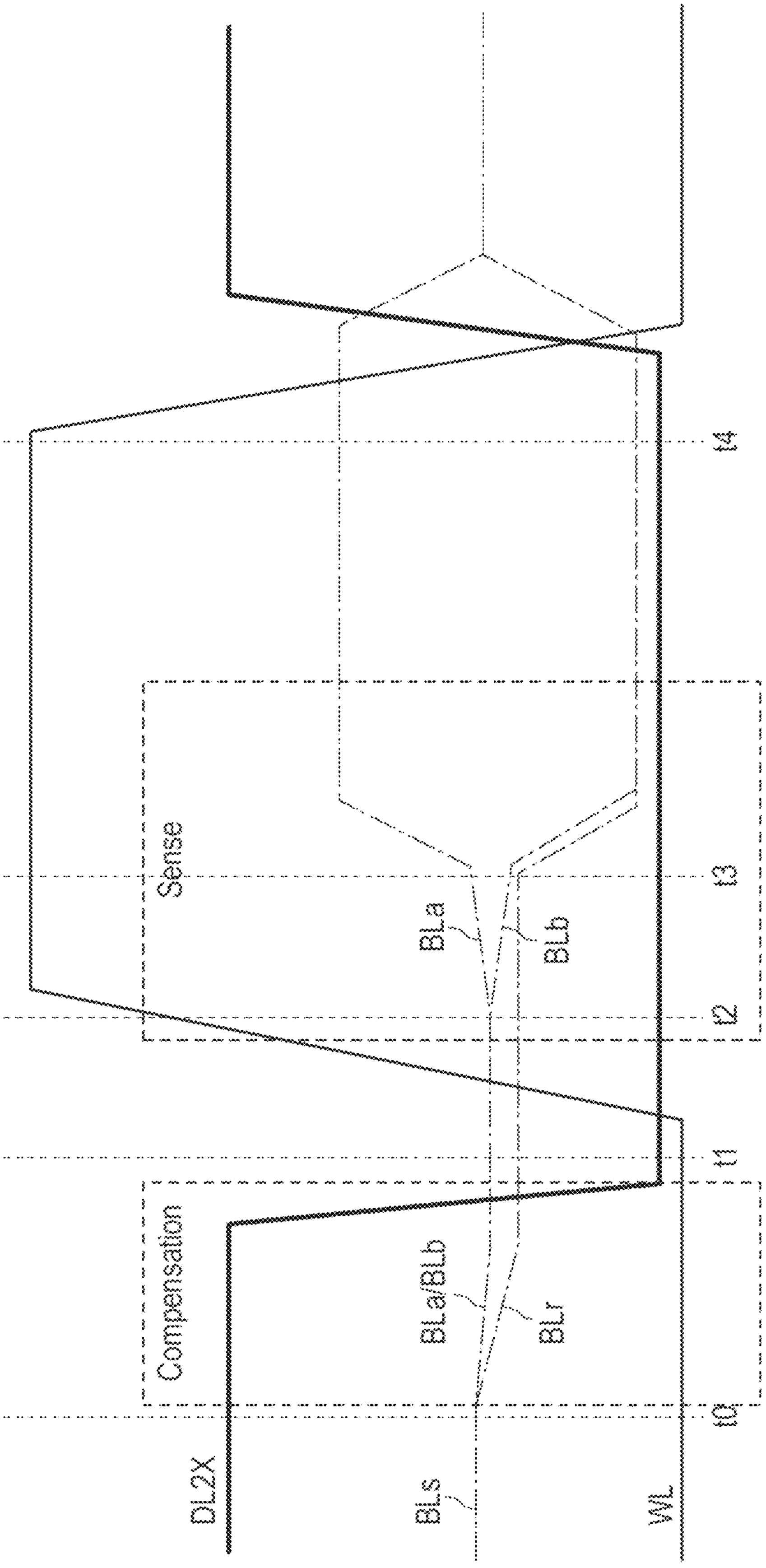
FIG. 4 is a timing diagram depicting various signals and voltages during a compensation operation and a sense operation, in accordance with an embodiment of the present disclosure.

FIG. 4 is a timing diagram depicting various signals and voltages during a compensation operation and a sense operation, in accordance with an embodiment of the present disclosure. In some embodiments, the timing diagram illustrates operation of the semiconductor device 300 of FIG. 3. FIG. 4 will be described with reference to the semiconductor device 300, but is not limited to the particular embodiment of FIG. 3. The example operation will describe a compensation and a sense operation when accessing memory cells in edge mat 304, for example, when activating a word line WL included in the edge mat 304.

Prior to time t0, bit lines 306*a-n* of the memory mat 302, bit lines 308*a-n* and bit lines 310*a-n* of the edge mat 304 are at a precharge level. In some embodiments, the precharge level is between the voltages for a logic high level and a logical low level (e.g., about halfway between VDD and VSS). Also prior to time t0, the DL2X signal is active (e.g., active high logical level) and word lines WL of the memory mat 302 and edge mat 304 are inactive (e.g., active low logical level). As a result of the active DL2X signal, the bit line switches 314*a-n* are activated and provide conductive paths between respective bit lines 308*a-n* and bit lines 310*a-n* of the edge mat 304. For example, activated bit line switch 314*a* provides a conductive path between bit line 308*a* and bit line 310*a*; activated bit line switch 314*b* provides a conductive path between bit line 308*b* and bit line 310*b*; activated bit line switch 314*c* provides a conductive path between bit line 308*c* and bit line 310*c*; and so on.

Following time t0, a threshold voltage compensation operation is performed for sense amplifiers 312*a-n*. During at least a part of the threshold voltage compensation operation the DL2X signal remains active so that the bit line switches 314*a-n* remain activated. As a result, the threshold voltage compensation operation is performed with a conductive path between bit lines 308*a-n* and bit lines 310*a-n*. Respective compensation voltages develop on gut nodes of the sense amplifiers 312*a-n*, illustrated in FIG. 4 following time t0 as a voltage difference between the bit lines 306 (BLr) and bit lines 308+310 (BLa/BLb).

Prior to time t1, the DL2X signal becomes inactive (e.g., inactive logical low level) and the threshold voltage compensation operation is completed. The inactive DL2X signal deactivates the bit line switches 314*a-n*, which isolates each of the bit lines 308*a-n* from a respective bit line 310*a-n*. For example, bit line 308*a* is isolated from 310*a* because bit line switch 314*a* is deactivated; bit line 308*b* is isolated from 310*b* because bit line switch 314*b* is deactivated; bit line 308*c* is isolated from 310*c* because bit line switch 314*c* is deactivated; and so on.

Following time t1, a word line WL is activated to activate memory cells in the edge mat 304 to be accessed. As a result, activated memory cells coupled to bit lines 308*a-n* provide respective stored charge states to respective bit lines 308*a-n*, and activated memory cells coupled to bit lines 310*a-n* provide respective stored charge states to respective bit lines 310*a-n*. For example, a memory cell coupled to bit line 308*a* that is activated by the active WL (e.g., a memory cell at the intersection of the active WL and bit line 308*a*) provides its stored charge state to bit line 308*a* and a different memory cell coupled to bit line 310*a* that is also activated by the active WL (e.g., a memory cell at the intersection of the same active WL and bit line 310*a*) provides its stored charge state to bit line 310*a*; a memory cell coupled to bit line 308*b* that is activated by the active WL (e.g., a memory cell at the intersection of the same active WL and bit line 308*b*) provides its stored charge state to bit line 308*b* and a different memory cell coupled to bit line 310*b* that is also activated by the active WL (e.g., a memory cell at the intersection of the same active WL and bit line 310*b*) provides its stored charge state to bit line 310; a memory cell coupled to bit line 308*c* that is activated by the active WL (e.g., a memory cell at the intersection of the same active WL and bit line 308*c*) provides its stored charge state to bit line 308*c* and a different memory cell coupled to bit line 310*c* that is also activated by the active WL (e.g., a memory cell at the intersection of the same active WL and bit line 310*c*) provides its stored charge state to bit line 310; and so one.

The stored charge states of the activated memory cells provided to the bit lines 308*a-n* cause the voltage of the respective bit line 308*a-n* to change. Likewise, the stored charge states of the activated memory cells provided to the bit lines 310*a-n* cause the voltage of the respective bit line 310*a-n* to change. The voltages of the bit lines 306*a-n* generally remain stable because no memory cells are activated in the memory mat 302. The change in voltages of the bit lines 308*a-n* and the change in voltages of the bit lines 310*a-n*, and the stable voltage of the bit lines 306*a-n* are illustrated in FIG. 4 following time t2. In the present example, the bit line 308 (BLa) is shown as changing to a higher voltage and the bit line 310 (BLb) is shown as changing to a relatively lower voltage. However, the change in voltage of each of bit line 308 and bit line 310 are independent from one another, and depends on the stored charge state of the activated memory cell coupled to bit line 308 and the charge state of the activated memory cell coupled to bit line 310, respectively. Thus, the voltages of bit lines 308 and 310 may both increase, both decrease, or one of the two increases while the other decreases.

Following time t3, the sense amplifiers 312*a-n* and single-ended sense amplifiers 316*a-n* are activated. For example, activation voltages may be provided to the sense amplifiers 312*a-n* and single-ended sense amplifiers 316*a-n* following time t3.

Each of the activated sense amplifiers 312*a-n* amplifies the voltage difference between a respective one of bit lines 306*a-n* and a respective one of bit lines 308*a-n*. In the present example, a bit line 308 (BLa) has a relatively higher voltage than a bit line 306 (BLr). An activated sense amplifier 312 coupled to the bit line 308 and bit line 306 amplifies the voltage difference by driving the bit line 308 to a high voltage level and drive the bit line 306 to a low voltage level.

Each of the activated single-ended sense amplifiers 316*a-n* drives a respective bit line 310*a-n* to a voltage level based on the voltage of the respective bit line 310*a-n* relative to a reference voltage (e.g., a precharge voltage level). In the present example, a bit line 310 (BLb) has a voltage that is relatively lower than the reference voltage. Consequently, an activated single-ended sense amplifier 316 coupled to the bit line 310 drives the bit line 310 to a low voltage level.

Following time t4, the word line WL is deactivated, which deactivates the memory cells coupled to bit line 308 and deactivates the memory cells coupled to bit line 310. Following deactivation of the word line WL, the sense amplifiers 312*a-n* and single-ended sense amplifiers 316*a-n* are deactivated, and additionally, the DL2X signal is activated to activate the bit line switches 314*a-n*. The activated bit line switches 314*a-n* provide conductive paths between respective bit lines 308*a-n* and bit lines 310*a-n*. Following activation of the bit line switches 314*a-n*, the bit lines 306*a-n*, 308*a-n*, and 310*a-n* are precharged to a precharge level in preparation for another access operation.

Figure 5:
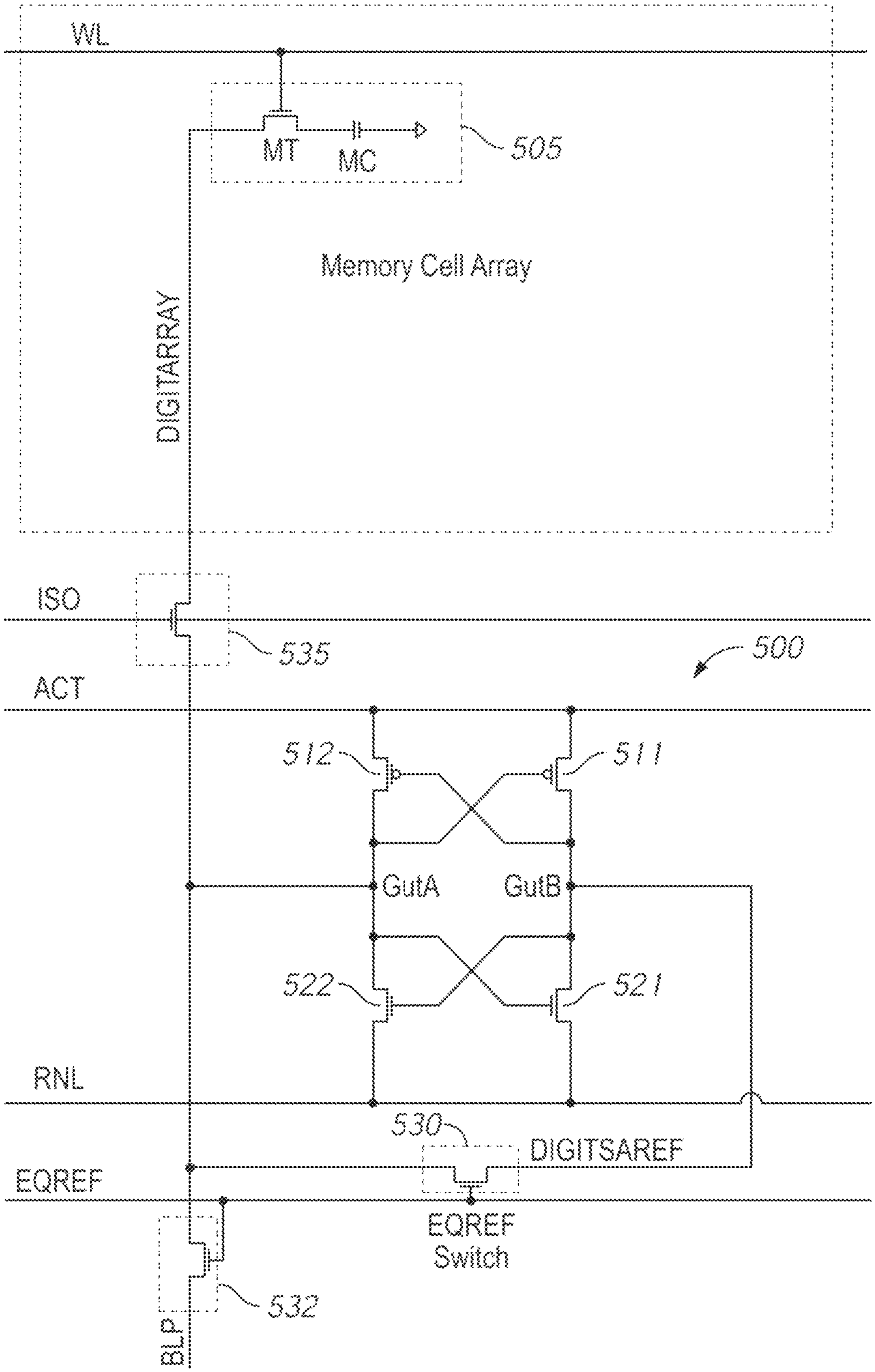
FIG. 5 is a schematic diagram of a single-ended sense amplifier, in accordance with an embodiment of the present disclosure.

FIG. 5 is a schematic diagram of a single-ended sense amplifier 500 in accordance with an embodiment of the present disclosure. The single-ended sense amplifier 500 may, in some embodiments, be included in the sense amplifier SAMP of FIG. 1. In some embodiments, the single-ended sense amplifier 500 may be included in single-ended sense amplifier regions 238 and/or 240 of FIG. 2, and/or included in single-ended sense amplifiers 316*a-n* of FIG. 3).

The sense amplifier 500 is shown coupled to activation voltage lines ACT and RNL, which may be charged with power voltages to activate the amplifier. For example, during an access operation, the voltage line ACT may be charged to an activation voltage, such as VDD, which represents a high logical level, while the voltage line RNL may be charged to a ground voltage such as VSS.

The sense amplifier 500 includes a first inverter circuit, which includes transistors 511 and 521. The first inverter has an input coupled to a node DIGITSA and an output node coupled to a gut node GutB. The transistor 511 has a source coupled to ACT, a drain coupled to GutB, and a gate coupled to DIGITSA. The transistor 511 may be a p-type transistor. The transistor 521 has a source coupled to RNL, a drain coupled to GutB and a gate coupled to DIGITSA. The transistor 521 may be an n-type transistor. Accordingly, when the signal at DIGITSA is at a high enough voltage, the transistor 521 will be activated and the transistor 511 will be inactive, which provides a conductive path between GutB and RNL through the transistor 521. When the signal at DIGITSA is at a low enough voltage, the transistor 521 may be inactive while the transistor 511 may be activated, which provides a conductive path between GutB and ACT through transistor 511.

The sense amplifier 500 includes a second inverter circuit, which includes transistors 512 and 522. The second inverter has an input coupled to a node DIGITSAREF and an output node coupled to a gut node GutA. The transistor 511 has a source coupled to ACT, a drain coupled to GutA, and a gate coupled to DIGITSAREF. The transistor 512 may be a p-type transistor. The transistor 522 has a source coupled to RNL, a drain coupled to GutA and a gate coupled to DIGITSAREF. The transistor 522 may be an n-type transistor. Accordingly, when the signal DIGITSAREF is at a high enough voltage, the transistor 522 will be activated and the transistor 512 will be inactive, which provides a conductive path between GutA and RNL through the transistor 522. When the signal DIGITSAREF is at a low enough voltage, the transistor 522 may be inactive while the transistor 512 may be activated, which provides a conductive path between GutA and ACT through transistor 512.

The sense amplifier 500 also includes transistors 530 and 532 that are activated by an active control signal EQREF, and further includes transistor 535 that is activated by an active control signal ISO. The transistor 535 provides a conductive path between DIGITSA and a bit line DIGITARRAY of a memory mat including memory cell 505. In some embodiments, the memory mat is an edge mat. When activated by an active word line WL, the memory cell 505 provides a stored charge state to the bit line DIGITARRAY. The transistor 530 provides a conductive path between DIGITSA and DIGITSAREF when activated by an active EQREF signal. The transistor 532 provides a conductive path between DIGITSA and a bit line precharge node BLP. The BLP node is provided a bit line precharge voltage.

Figure 6A:
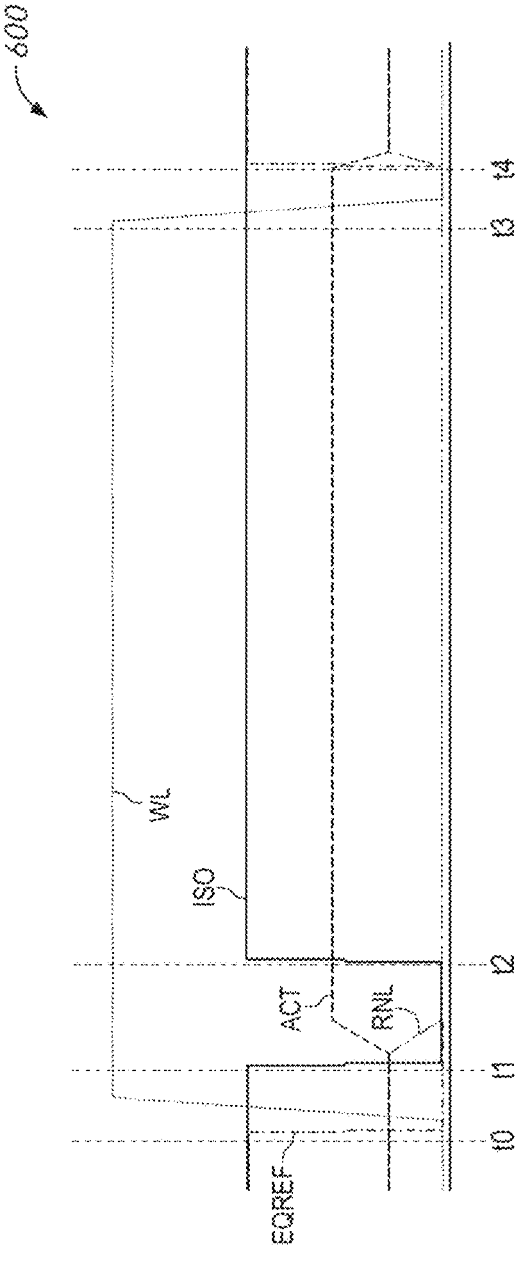
FIGS. 6A and 6B are timing diagrams depicting various signals and voltages during a sense operation using a single-ended sense amplifier, in accordance with an embodiment of the present disclosure.
Figure 6B:
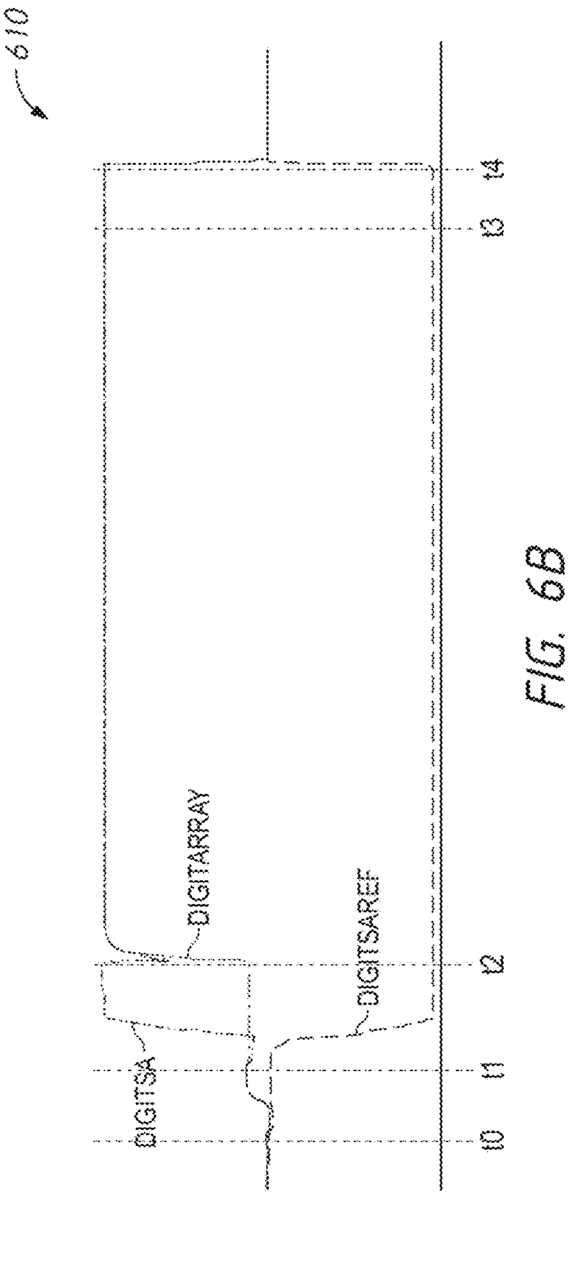

FIGS. 6A and 6B are timing diagrams 600 and 610 depicting various signals and voltages during a sense operation using a single-ended sense amplifier, in accordance with an embodiment of the present disclosure. The timing diagrams 600 and 610 show an example operation of a single-ended sense amplifier such as the single-ended sense amplifier 500 of FIG. 5 in some embodiments. The timing diagrams 600 and 610 are representational and not to scale, and different traces shown are not necessarily to the same scale. The timing diagrams 600 and 610 show time along a horizontal axis, and voltage along a vertical axis, with a low voltage generally representing a logical low, while a high voltage represents a logical high.

Before a time t0, the signals ISO and EQREF are active (e.g., at a high logical level), while ACT, RNL, DIGITSA, DIGITSAREF all at a precharge level which is between a logical high and a logical low voltage (e.g., about halfway between VDD and VSS). With both ISO and EQREF signals at an active level, transistor 535 is activated, and transistors 530 and 532 are activated to precharge the DIGITARRAY, DIGITSA, and DIGITSAREF to a precharge level provided to the BLP node.

Following time t0, the signal EQREF is deactivated (e.g., driven to a low logical level), and the word line WL may be driven to a high voltage (e.g., greater than VDD). As a result, the transistors 530 and 532 are deactivated to isolate DIGITSA from DIGITSAREF and cease providing the precharge level. The active WL activates the memory cell 505 to provide its stored charge state to the DIGITARRAY and to the DIGITSA through the still activated transistor 535 as shown in FIG. 6B. In the present example, the activated memory cell 505 causes the DIGITARRAY and DIGITSA to have higher voltages than DIGITSAREF.

Following time t1, the ISO signal is deactivated (e.g., driven to a low logical level) to deactivate the transistor 535 to isolate DIGITARRAY from DIGITSA. Also following time t1, the voltage provided to ACT is driven to a high voltage (e.g., VDD) and the voltage provided RNL is driven to a low voltage (e.g., VSS) from the precharge level. The voltages at ACT and RNL following time t1 activate the single-ended sense amplifier to amplify the voltage difference between DIGITSA and DIGITSAREF. In the present example, the higher voltage DIGITSA is driven by the single-ended sense amplifier to the voltage of ACT, and the lower voltage DIGITSAREF is driven by the single-ended sense amplifier to the voltage of RNL, as shown in FIG. 6B.

Following time t2, the ISO signal is activated to activate the transistor 535 to provide a conductive path between DIGITSA and DIGITARRAY. As a result, the voltage of ACT provided to DIGITSA by the single-ended sense amplifier also drives the DIGITARRAY to the voltage of ACT, thus restoring the original charge state stored by the memory cell 505.

Following time t3, the WL is deactivated to deactivate the memory cell 505 to retain the charge state.

Following time t4, the EQREF signal is activated to precharge the DIGITARRAY, DIGITSA, and DIGITSAREF to a precharge level provided to the BLP node, as shown in FIG. 6B. Additionally, the voltage at ACT and RNL also return to the precharge level. With ACT, RNL, DIGITSA, DIGITSAREF, and DIGITARRAY at the precharge level, the single-sided amplifier is ready for another sense operation.

Figure 7:
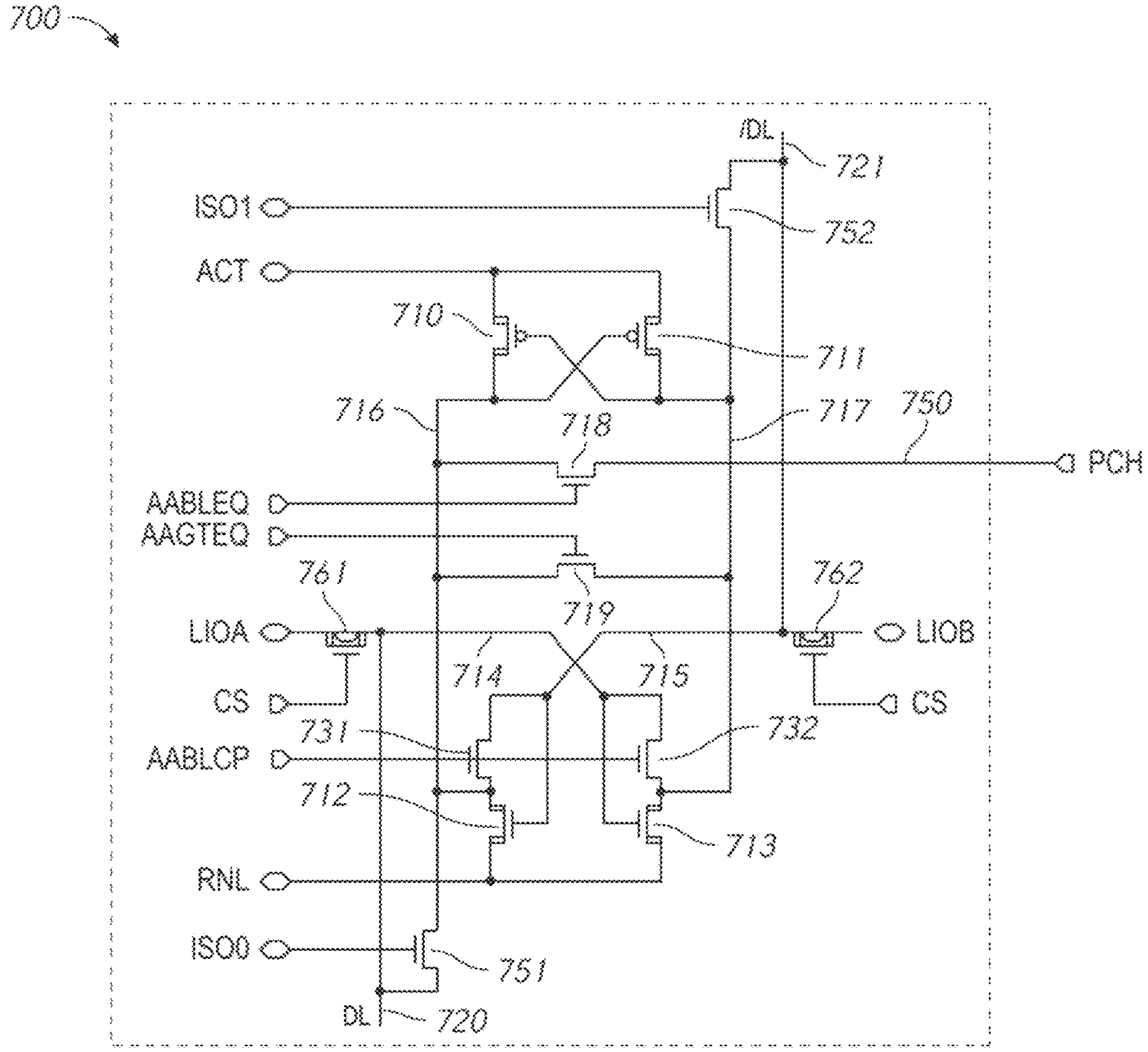
FIG. 7 is a circuit diagram of a sense amplifier, in accordance with an embodiment of the disclosure.

FIG. 7 is a circuit diagram of a sense amplifier 700, in accordance with an embodiment of the disclosure. In some embodiments, the sense amplifier 700 can be included in, for example, sense amplifier regions 224, 226, or 228 of FIG. 2 and/or sense amplifier 312*a-n* of FIG. 3. The sense amplifier 700 includes a first type of transistors (e.g. p-type field effect transistors (PFET)) 710, 711 having drains coupled to drains of second type of transistors (e.g., n-type field effect transistors (NFET) 712, 713, respectively. The first type of transistors 710, 711 and the second type of transistors 712, 713 form complementary transistor inverters including a first inverter including the transistors 710 and 712 and a second inverter including the transistors 711 and 713. The first type of transistors 710, 711 may be coupled to a Psense amplifier control line (e.g., an activation signal ACT), which may provide a supply voltage (e.g., an array voltage VARY) at an active "high" level. The second type of transistors 712, 713 may be coupled to an Nsense amplifier control line (e.g., a Row Nsense Latch signal RNL) that may provide a reference voltage (e.g., a ground (GND) voltage) at an active "low" level. The sense amplifier 700 may sense and amplify the data state applied to sense nodes 714, 715 through the digit (or bit) lines DL 720 and/DL 721, respectively. Nodes 716 and 717 that may be gut nodes coupled to drains of the second type of transistors 712, 713 may be coupled to the digit lines DL 720 and/DL 721 via isolation transistors 751 and 752. The isolation transistors 751 and 752 may be controlled by isolation signals ISO0 and ISO1. The digit lines DL 720 and/DL 721 (sense nodes 714 and 715) may be coupled to local input/output nodes A and B (LIOA/B) through the second type of transistors 761 and 762, respectively, which may be rendered conductive when a column select signal CS is active. The digit lines DL 720 and/DL 721 may represent digit lines included in a normal mat and/or an edge mat.

The sense amplifier may further include additional second type of transistors 731, 732 that have drains coupled to the sense nodes 715 and 714 and sources coupled to both the gut nodes 716 and 717 and the drains of the second type of transistors 712 and 713. Gates of the second types of transistors 731, 732 may receive a bit line compensation signal AABLCP and may provide voltage compensation for threshold voltage imbalance between the second type of transistors 712 and 713. The sense amplifier 700 may further include transistors 718, 719, where the transistor 718 may couple the gut node 716 to a global power bus 750 and the transistor 719 may couple the gut node 716 to the gut node 717. The global power bus 750 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 718 and 719 may couple the global power bus 750 to the gut nodes 716 and 717 responsive to equilibrating signals AAGTEQ and AABLEQ provided on gates of the transistors 718 and 719.

In operation, the sense amplifier 700 may be configured to sense a data state of a coupled memory cell on the data lines DL 720 and/DL 721 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 106 of FIG. 1), a row decoder (e.g., the row decoder 108 of FIG. 1), a column decoder (e.g., the column decoder 110 of FIG. 1), memory array control circuitry (e.g., the control circuitry of the memory cell array 118 of the memory banks BANK0-7 of FIG. 1), or any combination thereof A sense operation may include several phases, such as an initial or standby phase, a compensation phase, a gut equalize phase, and a sense phase.

Figure 8:
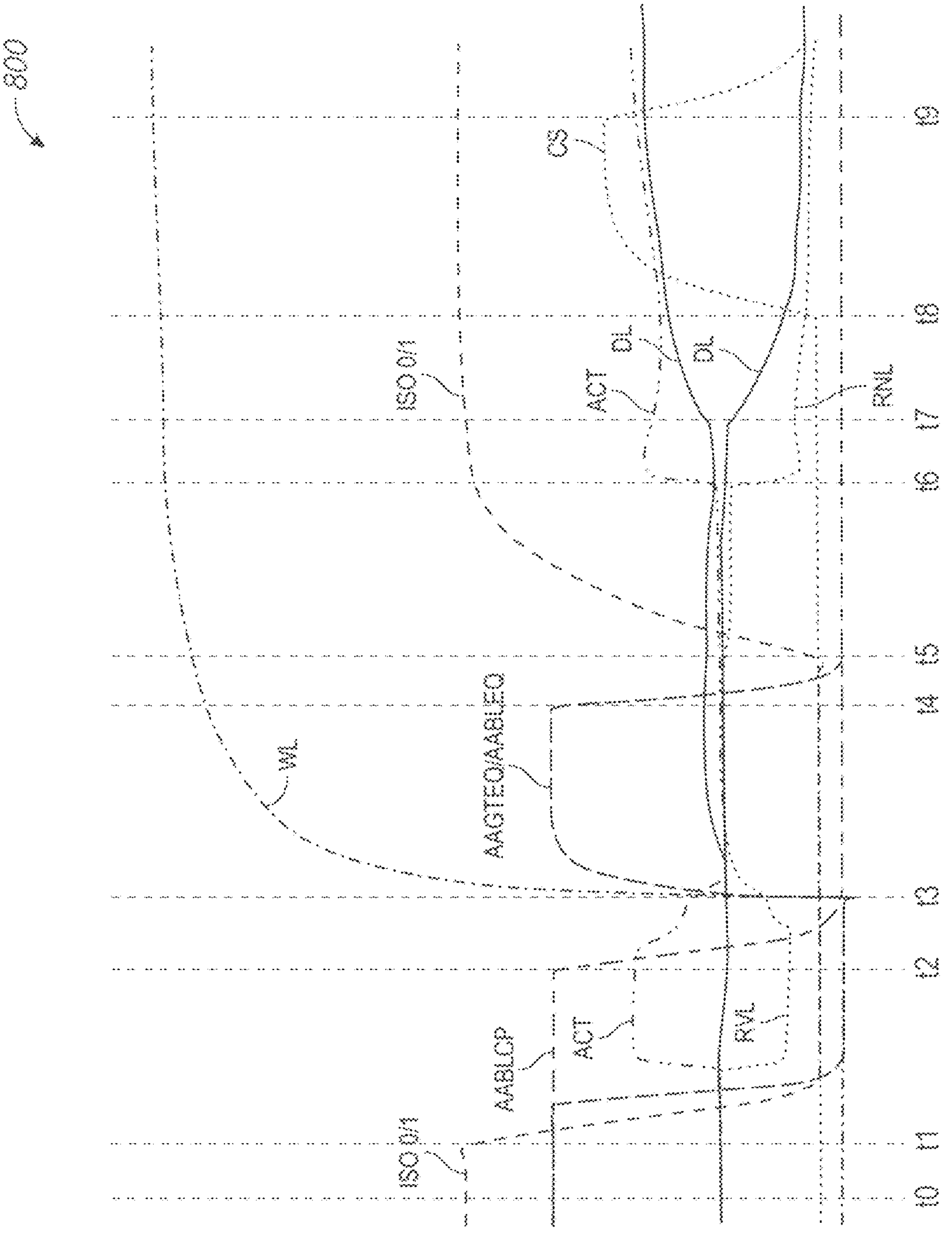
FIG. 8 is a timing diagram depicting various signals and voltages during a sense operation using a sense amplifier, in accordance with an embodiment of the present disclosure.

FIG. 8 is a timing diagram 800 depicting various signals and voltages during a sense operation using the sense amplifier 700 of FIG. 7, in accordance with an embodiment of the present disclosure. During the initial phase (e.g., between times t0 to t1 of the timing diagram 800 of FIG. 8), the gut nodes 716 and 717 may be precharged at the VPCH voltage. For example, the global power bus 750 may be supplied with the VPCH voltage and the AABLCP signal, the ISO0/ISO1 signals, and the AAGTEQ and AABLEQ signals may be in their active states, respectively. Accordingly, while in the initial phase, each of the digit lines DL 720 and/DL 721, the sense nodes 714 and 715 and the gut nodes 716 and 717 may be precharged to the precharge voltage VPCH. In some examples, the VPCH voltage may be the VBLP voltage. The VBLP voltage may be approximately half of the VARY voltage.

After the initial phase, the sense amplifier 700 may enter the threshold voltage compensation phase (e.g., to perform a threshold voltage compensation operation) (e.g., between times t1 and t2 of the timing diagram 800 of FIG. 8), where voltages on the data lines DL 720 and/DL 721 are biased from the VPCH voltage (e.g., VBLP voltage) to compensate (e.g., provide threshold voltage compensation) for threshold voltage differences between the transistors 712, 713. During the compensation phase, at time t1, the ISO0 and ISO1 signals and the AAGTEQ and AABLEQ signals may be set to respective inactive states to disable the transistors 751, 752, 718 and 719. The AABLCP signal may remain in an active state to enable the transistors 731 and 732 to couple the nodes 714 and 715 to the gut nodes 717 and 716, respectively. Additionally, the drain and the gate of the transistor 712 may be coupled and the drain and the gate of the transistor 713 may be coupled. At time t2, the compensation phase may be completed by transitioning the AABLCP signal to an inactive state, which disables the transistors 731 and 732 and decouples the nodes 714 and 715 from the gut nodes 717 and 716, respectively.

During the gut equalize phase (e.g., between times t3 and t4 of the timing diagram 800 of FIG. 8), the gut nodes 717 and 716 may be decoupled from the digit lines DL 720 and/DL 721 and may be coupled to each other to equalize voltages between the gut nodes 716, 717 to the VPCH voltage. During this phase, at time t3, the AAGTEQ and AABLEQ signals may transition to an active state. While the AABLCP signal is set to the inactive state, the transistors 732 and 731 may decouple the nodes 714 and 715 from the gut nodes 717 and 716. While the equilibrating signals AAGTEQ and AABLEQ are set to the active state, the transistors 718 and 719 may couple the VPCH voltage from the global power bus 750 to the gut nodes 716, 717. While the ISO0 and ISO1 signals are set to the inactive state, the isolation transistors 751 and 752 may decouple the gut nodes 717 and 716 from the digit lines DL 720 and/DL 721. After the gut nodes 716 and 717 are precharged to the VPCH voltage, the AAGTEQ and AABLEQ signals may be set to inactive states to disable the transistors 718 and 719, at time t4. Also during the gut equalization phase, at time t3, a word line WL associated with the sense operation may be set to an active state. In some other examples, the word line WL may be activated during the threshold voltage compensation phase.

During the sense phase (e.g., between times t5 and t8 of the timing diagram 800 of FIG. 8), the sense amplifier 700 may sense a data state of memory cell coupled to the data line DL 720 or/DL 721. At time t5, the ISO0 and ISO1 isolation signals may be set to an active state. At time t6, the ACT signal and the RNL signal may be activated and set to the logical high level (e.g., the VARY voltage) and the logical low level (e.g., the GND voltage), respectively. Responsive to the ISO0 and ISO1 isolation signals transitioning to the active state, the ISO transistor 751 may couple the digit line DL 720 to the gut node 716 and the ISO transistor 752 may couple the digit line/DL 721 to the gut node 717. During the sense phase, sense and amplify operations are then performed with the threshold voltage compensation voltage to balance the responses of the second type of transistors 712 and 713. For example, in response to a memory cell being coupled to a digit line DL 720 or/DL 721 through its respective access device, a voltage difference is created between the digit lines DL 720 and/DL 721 (e.g., via the guts nodes 716 and 717). Thus, at time t7, the voltage difference is sensed by the second type of transistors 712, 713 as the sources of the second type of transistors 712, 713 begin to be pulled to ground through fully activated RNL signal, and one of the second type of transistors 712, 713 with a gate coupled to the digit line DL 720 or/DL 721 with the slightly higher voltage begins conducting. When a memory cell coupled to the gut node 716 through the digit line DL 720 stores a high data state, for example, the transistor 713 may begin conducting. Additionally, the other transistor 712 may become less conductive as the voltage of the gut node 717 with the slightly lower voltage decreases through the conducting transistor 713. Thus, the slightly higher and lower voltages are amplified to logical high and logical low voltages while the isolation signals ISO0 and ISO1 in the active state. As shown in the timing diagram 800 of FIG. 8, because the isolation signals ISO0 and ISO1 were set active to couple the gut nodes 716, 717 to the respective digit lines DL 720 and/DL 721 (at time t5) prior to activating sense amplifier (e.g., setting the ACT signal and the RNL signal active at time t6), the gut nodes 716, 717 (e.g., and digit lines DL 720 and/DL 721) may be steadily driven to the ACT and RNL voltages, respectively, starting at time t7. If activation of the ACT and RNL signals occurred before the isolation signals ISO0 and ISO1 were set active, the voltages of the gut nodes 716, 717 may experience a brief discharge/charge period when coupled to the digit lines DL 720 and/DL 721 before resuming charging to the ACT and RNL signal voltages, respectively, which may introduce an extra delay and increase tRCD. By first coupling the gut nodes 716, 717 to the respective digit lines DL 720 and/DL 721, and then activating the ACT signal and the RNL signal, the brief discharge/charge delay period may be reduced or avoided.

After the data state of the memory cell is sensed, and the sense nodes 714, 715 are each pulled to a respective one of the ACT signal and RNL signal voltages, a read may be performed in response to a READ command. For example, at time t8, the CS signal may be activated (e.g., in response to the READ command), the digit lines DL 720 and/DL 721 (e.g., at sense nodes 714 and 715) may be coupled to the LIO nodes (LIOA and LIOB) and the data output may be provided to the LIO nodes. Thus, the data may be read out from the LIO nodes. After a read operation is completed, at time t9, the CS signal may be set to an inactive state. The process may start over for a second sensing operation.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus, comprising:

a first memory mat comprising a first plurality of memory cells at respective intersections of a first plurality of word lines and a first plurality of bit lines;

a second memory mat comprising a second plurality of memory cells at respective intersections of a second plurality of word lines and a second plurality of bit lines and further comprising a third plurality of memory cells at respective intersections of the second plurality of word lines and a third plurality of bit lines;

a first plurality of sense amplifiers each coupled to a respective one of the first plurality of bit lines and a respective one of the second plurality of bit lines;

a second plurality of sense amplifiers each coupled to a respective bit line of the third plurality of bit lines, wherein the second plurality sense amplifiers comprise single-ended sense amplifiers; and a plurality of bit line switches, each bit line switch of the plurality of bit line switches coupled to a respective bit line of the second plurality of bit lines and to a respective bit line of the third plurality of bit lines, each bit line switch configured to provide a conductive path between the respective bit line of the second plurality of bit lines and the respective bit line of the third plurality of bit lines when activated.

2. The apparatus of claim 1, wherein each bit line switch of the plurality of bit line switches is configured to be activated during a threshold voltage compensation operation and deactivated during a memory cell activation operation.

3. The apparatus of claim 1, wherein the first plurality of sense amplifiers comprise threshold voltage compensation sense amplifiers.

4. The apparatus of claim 1 comprising a first memory cell of the second plurality of memory cells and a second memory cell of the third plurality of memory cells, wherein the first memory cell and the second memory cell are at respective intersections of a same word line of the second plurality of word lines, and wherein the first memory cell and the second memory cell are configured to have different respective values.

5. The apparatus of claim 1, further comprising:

a decoder circuit configured to activate a bit line switch of the plurality of bit line switches during a threshold voltage compensation operation and deactivate the bit line switch during a memory cell activation operation.

6. The apparatus of claim 5, wherein the decoder circuit is configured to transmit a switch activation signal to activate the bit line switch of the plurality of bit line switches.

7. A method, comprising:

activating a bit line switch, wherein the bit line switch, when activated, provides a conductive path between a first bit line in a memory mat and a second bit line in the memory mat;

performing a threshold voltage compensation operation using the first bit line and the second bit line, wherein the first bit line and the second bit line having the conductive path therebetween via bit line switch during the threshold voltage compensation operation; and deactivating the bit line switch before activating a word line of the memory mat to access a first memory cell coupled to the first bit line and to access a second memory cell coupled to the second bit line.

8. The method of claim 7, further comprising:

activating the word line;

accessing the first memory cell using a single-ended sense amplifier.

9. The method of claim 8, wherein the threshold voltage compensation operation is performed for a threshold voltage compensation sense amplifier.

10. The method of claim 9, further comprising:

accessing the second memory cell using the threshold voltage compensation sense amplifier.

11. The method of claim 7, further comprising:

activating the bit line switch and performing a precharge operation for the first bit line and the second bit line.

12. An apparatus, comprising:

a plurality of single-ended sense amplifiers;

an edge mat comprising a plurality of first bit lines and a plurality of second bit lines, wherein each of the plurality of single-ended sense amplifiers is coupled to a corresponding one of the plurality of first bit lines, and wherein the plurality of single-ended sense amplifiers are not coupled to the plurality of second bit lines; and a plurality of bit line switches, each bit line switch of the plurality of bit line switches configured to provide a conductive path between a respective one of the plurality of first bit lines and a respective one of the plurality of second bit lines in response to a switch activation signal.

13. The apparatus of claim 12, further comprising:

a memory mat comprising a plurality of third bit lines; and a plurality of sense amplifiers, each sense amplifier in the plurality of sense amplifiers coupled between a respective one of the plurality of second bit lines and a respective one of the plurality of third bit lines.

14. The apparatus of claim 12, wherein each bit line switch of the plurality of bit line switches is configured to provide the conductive path during a threshold voltage compensation operation.

15. The apparatus of claim 14, wherein each bit line switch of the plurality of bit line switches is configured not to provide the conductive path during a memory cell access operation.

* * * * *